United States Patent
Hongo et al.

(10) Patent No.: US 8,980,671 B2
(45) Date of Patent: Mar. 17, 2015

(54) SEMICONDUCTOR DEVICE AND MANUFACTURING METHOD OF SEMICONDUCTOR DEVICE

(75) Inventors: Satoshi Hongo, Oita (JP); Kazumasa Tanida, Oita (JP); Akihiro Hori, Oita (JP); Kenji Takahashi, Ibaraki (JP); Hideo Numata, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 13/368,930

(22) Filed: Feb. 8, 2012

(65) Prior Publication Data
US 2012/0217600 A1    Aug. 30, 2012

(30) Foreign Application Priority Data

Feb. 24, 2011    (JP) .................................. 2011-038439

(51) Int. Cl.
*H01L 21/00* (2006.01)
*H01L 21/30* (2006.01)
*H01L 21/46* (2006.01)
*H01L 27/146* (2006.01)
*H01L 21/84* (2006.01)
*H01L 27/12* (2006.01)

(52) U.S. Cl.
CPC ............ *H01L 27/1464* (2013.01); *H01L 21/84* (2013.01); *H01L 27/1203* (2013.01); *H01L 27/14634* (2013.01); *H01L 27/1469* (2013.01); *H01L 27/14621* (2013.01); *H01L 27/14627* (2013.01)
USPC .................. 438/57; 438/59; 438/70; 438/455; 438/459; 257/E21.088; 257/E21.122; 257/E21.567

(58) Field of Classification Search
None
See application file for complete search history.

(56) References Cited

U.S. PATENT DOCUMENTS

| 7,897,427 | B2 | 3/2011 | Sakai |
| 8,164,126 | B2 | 4/2012 | Moon et al. |
| 8,378,402 | B2 | 2/2013 | Moon et al. |
| 8,524,574 | B2 | 9/2013 | Sakai |

(Continued)

FOREIGN PATENT DOCUMENTS

| CN | 101604657 A | 12/2009 |
| JP | 63-228710 A | 9/1988 |

(Continued)

OTHER PUBLICATIONS

Okuyama, English Machine Translation of JP Patent publication No. 2005-259828, Sep. 22, 2005; (Machine translated Jul. 12, 2014).*

(Continued)

*Primary Examiner* — Mohsen Ahmadi
(74) *Attorney, Agent, or Firm* — Oblon, McClelland, Maier & Neustadt, L.L.P.

(57) ABSTRACT

A manufacturing method of a semiconductor device according to embodiments includes forming a photodiode layer, which is an active region including a photodiode, on a main surface of a first substrate, forming a wiring layer, which includes a wire and a dielectric layer covering the wire, on the photodiode layer, and forming a dielectric film on the wiring layer. The manufacturing method of the semiconductor device according to the embodiments further includes bonding a second substrate to the dielectric film of the first substrate so that a crystal orientation of the photodiode layer matches a crystal orientation of the second substrate.

11 Claims, 5 Drawing Sheets

(56) References Cited

U.S. PATENT DOCUMENTS

| | | |
|---|---|---|
| 2006/0180860 A1* | 8/2006 | Pan et al. .................. 257/347 |
| 2008/0203452 A1 | 8/2008 | Moon et al. |
| 2009/0315134 A1 | 12/2009 | Maruyama et al. |
| 2010/0184246 A1 | 7/2010 | Sakai |
| 2011/0136295 A1 | 6/2011 | Sakai |
| 2011/0217795 A1 | 9/2011 | Tanida et al. |
| 2011/0304003 A1 | 12/2011 | Tanida et al. |
| 2012/0187463 A1 | 7/2012 | Moon et al. |

FOREIGN PATENT DOCUMENTS

| | | |
|---|---|---|
| JP | 5-109594 | 4/1993 |
| JP | 5-152549 | 6/1993 |
| JP | 10-144954 A | 5/1998 |
| JP | 2001-93787 A | 4/2001 |
| JP | 2002-134374 | 5/2002 |
| JP | 2002-305291 | 10/2002 |
| JP | 2003-347522 | 12/2003 |
| JP | 2004-119943 | 4/2004 |
| JP | 2005-259828 A | 9/2005 |
| JP | 2007-220781 A | 8/2007 |
| JP | 2007-324629 A | 12/2007 |
| JP | 2008-211220 | 9/2008 |
| TW | 201103133 A1 | 1/2011 |

OTHER PUBLICATIONS

Xiang et al., English Machine Translation of CN document No. 101604657, Published on Dec. 16, 2009; (Machine translated Jul. 12, 2014).*
U.S. Appl. No. 13/220,001, filed Aug. 29, 2011, Takashi Shirono et al.
U.S. Appl. No. 13/212,644, filed Aug. 18, 2011, Kazumasa Tanida et al.
Satoshi Hongo, et al., "Direct wafer bonding technology of 300mm wafer", Solid State Devices and Materials, Nagoya, 2011, pp. 48-49.
Taiwanese Office Action issued Mar. 24, 2014, in Taiwan Patent Application No. 101105357 (with English translation).
U.S. Appl. No. 13/422,966, filed Mar. 16, 2012, Yamaguchi, et al.
U.S. Appl. No. 13/428,424, filed Mar. 23, 2012, Hongo.
U.S. Appl. No. 13/479,968, filed May 24, 2012, Hongo, et al.
Office Action issued on Jan. 28, 2014, in Japanese Patent Application No. 2011-038439 with English translation.
Combined Chinese Office Action and Search Report issued Mar. 5, 2014 in Patent Application No. 201210043827.1 (with English translation of the Office Action and English translation of categories of cited documents)
Office Action issued Aug. 26, 2014 in Chinese Patent Application No. 201210043827.1 (with English language translation).
Chinese Office Action dated Dec. 2, 2014, issued in Chinese Patent Application No. 201210043827.1 (with English translation).

* cited by examiner

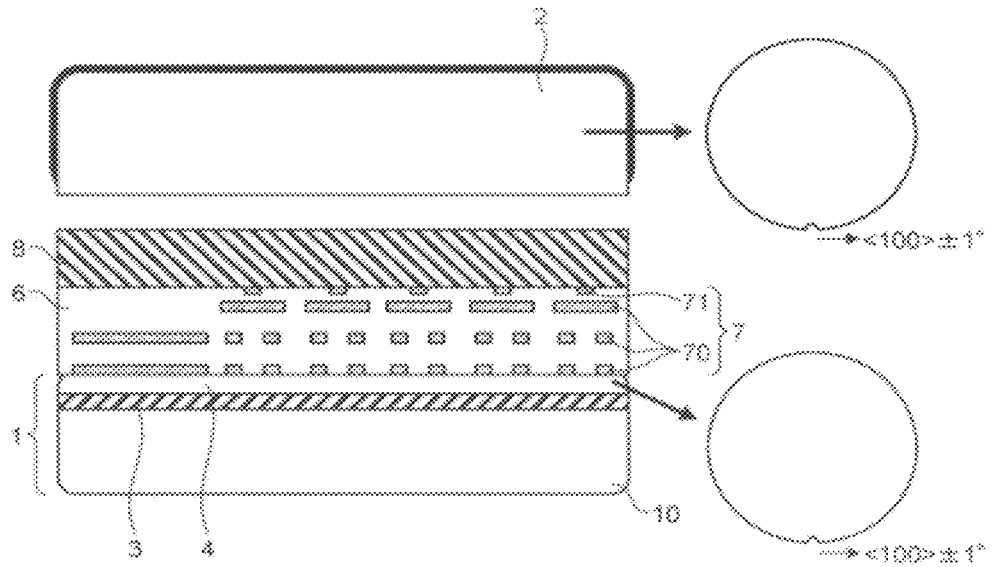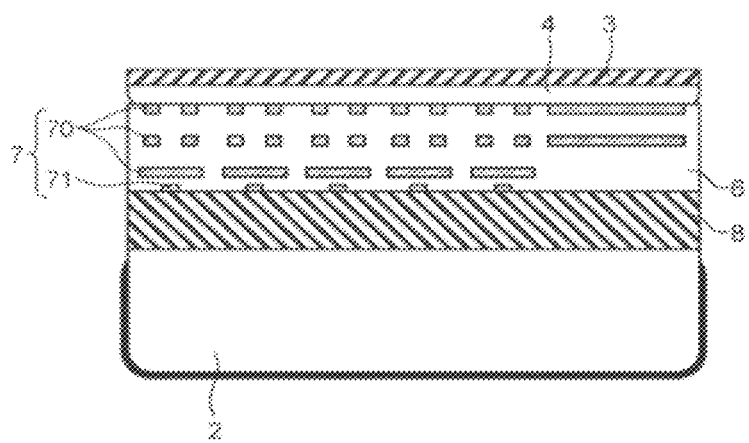

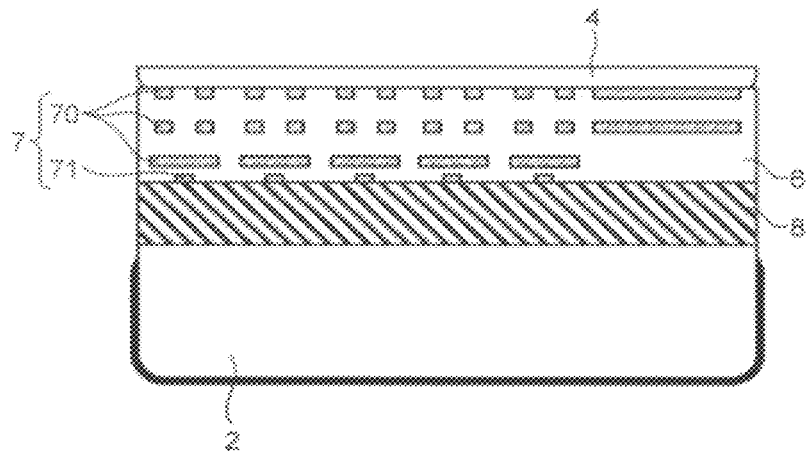
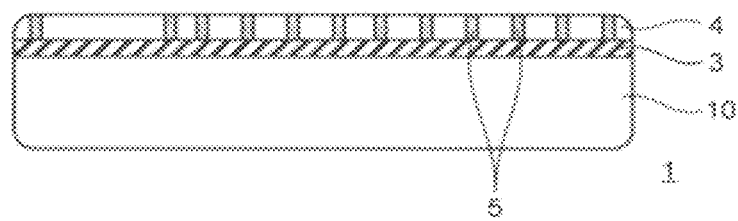
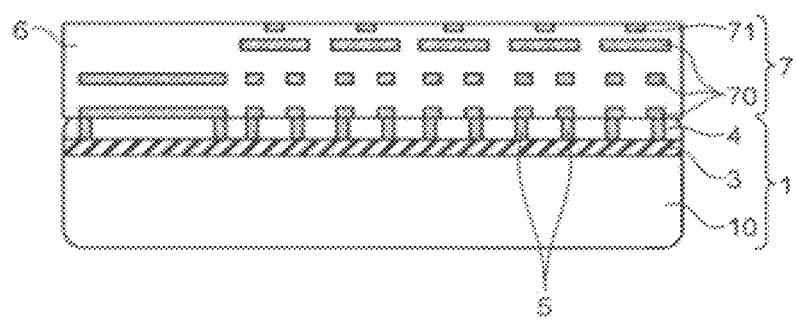

US 8,980,671 B2

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese Patent Application No. 2011-38439, filed on Feb. 24, 2011; the entire contents of which are incorporated herein by reference.

FIELD

The present embodiments typically relate to a semiconductor device and a manufacturing method of a semiconductor device.

BACKGROUND

In backside-illuminated CMOS image sensors, it is needed to bond a device wafer on which a wiring layer is formed and a support wafer for supporting it by a direct bonding method and thereafter remove Si of the device wafer and manufacture a wiring layer for drawing out an electrode to a package.

When a lithography process is performed after removing Si of the device wafer, there is a problem that the wiring layer is displaced by about 10 to 500 nm from an original correct position. Specially, in CMOS image sensors, tolerance of an amount of positional displacement in a color filter process is tight and spectral characteristics are affected, so that wafer yield is directly affected.

BRIEF DESCRIPTION OF THE DRAWINGS

FIG. 4 is a cross-sectional view illustrating one process of the manufacturing method of the semiconductor device according to the first embodiment;

FIG. 5 is a cross-sectional view illustrating one process of the manufacturing method of the semiconductor device according to the first embodiment;

FIG. 6 is a cross-sectional view illustrating one process of the manufacturing method of the semiconductor device according to the first embodiment;

FIG. 7 is a cross-sectional view illustrating one process of the manufacturing method of the semiconductor device according to the second embodiment;

FIG. 8 is a cross-sectional view illustrating one process of the manufacturing method of the semiconductor device according to the second embodiment;

DETAILED DESCRIPTION

A manufacturing method of a semiconductor device according to embodiments includes forming a photodiode layer, which is an active region including a photodiode, on a main surface of a first substrate, forming a wiring layer, which includes a wire and a dielectric layer covering the wire, on the photodiode layer, and forming a dielectric film on the wiring layer. The manufacturing method of the semiconductor device according to the embodiments further includes bonding a second substrate to the dielectric film of the first substrate so that a crystal orientation of the photodiode layer matches a crystal orientation of the second substrate.

A manufacturing method of a semiconductor device according to the embodiments will be explained in detail below with reference to the accompanying drawings. The present invention is not limited to these embodiments.

First Embodiment

A manufacturing method of a semiconductor device according to the present embodiment can be applied to, for example, a manufacturing method of a backside-illuminated CMOS image sensor. The manufacturing method of the semiconductor device according to the present embodiment is explained below with reference to FIG. 1 to FIG. 6.

Figure 1:
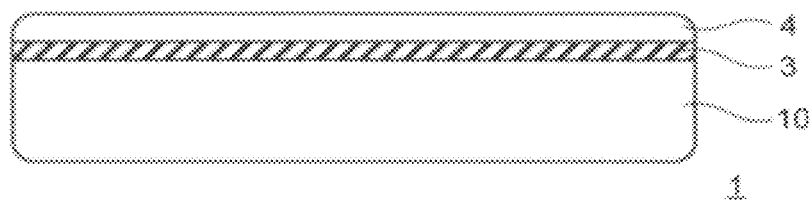
FIG. 1 is a cross-sectional view illustrating one process of a manufacturing method of a semiconductor device according to first and second embodiments.

As a first substrate 1 as a device wafer, for example, a SOI wafer or a single- or multilayer epitaxial substrate is used. FIG. 1 illustrates a cross-sectional view in a case where a SOI wafer is used as the first substrate 1. The first substrate 1 includes a silicon layer 10, a BOX oxide film that functions as an etching stopper layer 3 to be described layer, and a silicon layer 4.

A process called FEOL (Front End of Line), such as a lithography process, a film forming process, an etching process, and an ion implantation process, is repeatedly performed on the silicon layer 4 (photodiode layer) to form an active layer, and moreover, devices, such as transistors and photodiodes, are manufactured in the active layer.

Figure 2:
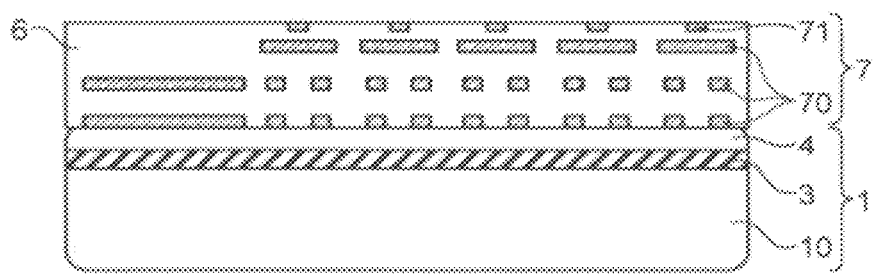
FIG. 2 is a cross-sectional view illustrating one process of the manufacturing method of the semiconductor device according to the first embodiment.

Next, as shown in FIG. 2, a wiring layer 7 for electrical connection is formed in a process called BEOL (Back End of Line). For example, wires 70 of the wiring layer 7 may be Cu of a damascene structure. Moreover, Al may be used for upper wires 71. A dielectric layer 6 that covers the wires 70 and the upper wires 71 is, for example, a TEOS (Tetra Ethyl Ortho Silicate) film.

Figure 3:
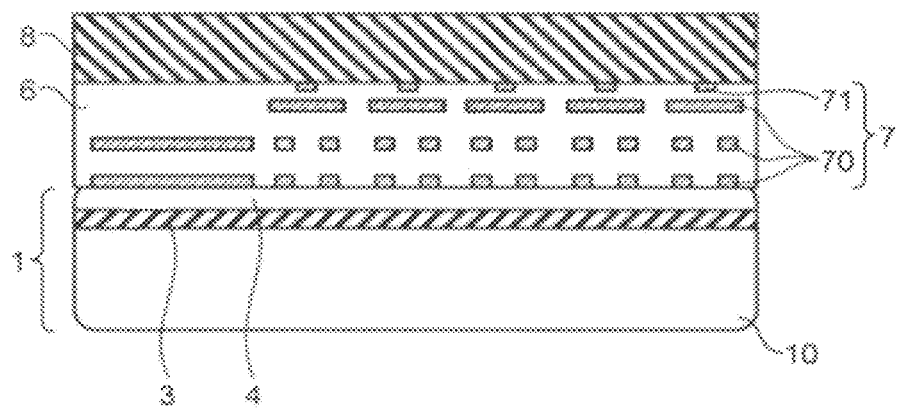
FIG. 3 is a cross-sectional view illustrating one process of the manufacturing method of the semiconductor device according to the first embodiment.

An outermost surface after forming the wiring layer 7 becomes a bonding surface and therefore needs to be planarized. For example, a process (CVD, application, or the like) of forming a dielectric film 8 and a process (CMP (Chemical Mechanical Polish), RIE, or the like) of grinding the dielectric film 8 are repeatedly performed to form the dielectric film 8 to be a flat outermost surface as shown in FIG. 3. When the wiring layer 7 includes only a Cu wire of a damascene structure, the wiring layer 7 is planarized by CMP when forming the damascene structure, so that the outermost surface does not necessarily need to be planarized again. Moreover, the dielectric film 8 as the bonding surface may be an oxide film, or $SiO_2$ using TEOS or the like as a material or a Low-k film may be used for the dielectric film 8.

The first substrate 1 subjected to the above processes is bonded to a second substrate 2 as a support wafer as shown in FIG. 4. The first substrate 1 and the second substrate 2 are bonded so that the crystal orientation of the silicon layer 4 (photodiode layer) of the first substrate 1 and the crystal orientation of the second substrate 2 are the same. For example, as shown in FIG. 4, the crystal orientations are matched by bonding substrates, in which an arrow direction viewed from a notch becomes a <100> direction, so that the notches are aligned. When the crystal orientations of the silicon layer 10 and the silicon layer 4 are aligned (same), the two substrates, i.e., the first substrate 1 and the second substrate 2 are aligned without positional displacement. The direction of the crystal orientations to be aligned does not necessarily need to be a <100> direction, and if the internal stress of the substrates can be relieved, the direction may be a <110> direction or may be different from each other as long as the crystal orientations are aligned in the same direction. An SOI substrate may be used as the second substrate 2.

The surface of the second substrate 2 may be, for example, an unprocessed substrate surface. Alternatively, the surface of the second substrate 2 may be a surface obtained by once forming a film thereon and exposing the substrate surface by performing dry etching, such as RIE, on the surface of the film. Moreover, a $SiO_2$ using TEOS as a material, a thermal oxide $SiO_2$ film, or the like may be the bonding surface of the second substrate 2. Alternatively, a surface of a dielectric layer formed on a wiring layer may be the bonding surface of the second substrate 2.

The process of bonding the first substrate 1 and the second substrate 2 includes a process of cleaning the bonding surfaces, a process of activating the bonding surfaces, and a process of cleaning the bonding surfaces again (not shown). In the process of cleaning the bonding surfaces, cleaning of removing metal contaminations, such as alkaline or acid cleaning, and cleaning of removing organic substances, such as an $O_3$ process, are performed. Moreover, two liquid cleaning or mega sonic (Mega Sonic) cleaning may be used for removing dust.

Moreover, in the process of activating the bonding surfaces, a plasma process, such as ion beam, ion gun, and RIE, may be used. As a gas used for the activation, for example, Ar, $N_2$, $O_2$, $H_2$, or the like is used, and the bonding surfaces are activated under the condition in which the surfaces are not easily damaged. The gaseous species may, of course, be a mixed gas or a single gas.

After the above activation, in the process of cleaning the bonding surfaces again, a cleaning method, such as two liquid cleaning, mega sonic (Mega Sonic) cleaning, or only water washing, which does not damage the active layer, is used for removing dust adhered mainly in the activating process. When the process from the activation to the bonding is performed continuously in a vacuum, re-cleaning is, of course, not performed. Moreover, when cleanliness from the activation to the bonding is sufficiently high, re-cleaning may be omitted.

In the bonding, after aligning the two substrates, i.e., the first substrate 1 (the silicon layer 4) and the second substrate 2 without positional displacement as shown in FIG. 4, the substrates are bonded, for example, by pressurizing the central portion and causing a bonding wave of spontaneous bonding to extend concentrically. In the alignment at this time, the substrates need to be aligned with sub-um accuracy by using, for example, a mechanical, shape recognition, or mark alignment method.

After the bonding, a positional displacement measurement (XYθ) between the substrates and a void inspection are performed if needed to inspect the condition of the bonding. In the positional displacement inspection, shape detection of a transmission method, edge detection of a reflection method, or the like is used. Moreover, in the void inspection, infrared light, (IR), ultrasonic wave (SAT), X-ray, or the like is used.

The substrate obtained by bonding the first substrate 1 and the second substrate 2 is annealed for a few hours at a high temperature of 200 to 1000° C. to improve the bonding strength. Typically, the strength tends to be higher as the temperature is higher, however, the annealing is limited up to a temperature of about 400° C. for a few hours in view of the upper temperature limit of a FEOL material. Moreover, when the strength immediately after the bonding is sufficiently high, the annealing can be omitted, performed at a lower temperature, or shortened.

Thereafter, as shown in FIG. 5, the surface on the first substrate 1 side is thinned by BSG (Back Side Grind) by mechanical grinding, a chemical liquid process (hydrofluoric-nitric acid, KOH, TMAH), or the like. In the thinning process, for example, the substrate is processed while controlling accuracy of in-plane uniformity, roughness, and the like by performing end point detection by the etching stopper layer 3 or thickness control. Specially, when the etching stopper layer 3 is used, a BOX oxide film of a SOI wafer or a concentration difference of a multilayer epitaxial substrate is used as the etching stopper layer 3. Thereafter, the etching stopper layer 3 is removed by RIE or chemicals if needed (FIG. 6).

Thereafter, a pad (hereinafter, not shown) for drawing out an electrode to a package is formed on the silicon layer 4 in FIG. 6. For example, the pad can be manufactured by forming a wiring layer by lithography, CVD, and sputtering or exposing the upper wires 71 by RIE or the like. At this time, a light shielding layer of a circuit portion and the like may be formed concurrently. Moreover, a film that can improve sensor characteristics may be formed on the sensor.

Thereafter, an antireflection film, color filters (CF: Color Filter), and microlenses are formed to complete a process called wafer process. Next, in a package process called back end, singulation by dicing, mounting on a ceramic package or the like, electrical connection between the electrodes and the package by wire bonding, mounting of a protection glass, and resin sealing are performed, so that functions as a sensor semiconductor device are completed.

According to the present embodiment, because the crystal orientation of the notch of the wafer on which the photodiode layer is formed and the crystal orientation of the notch of the support wafer are set to the same orientation, stress due to difference in Young's modulus that depends on a crystal orientation is reduced, so that pattern deformation after the bonding can be suppressed. In other words, displacement (pattern distortion) of a wiring layer due to stress attributed to a crystal orientation of a wafer can be reduced and thus characteristics of a process in which an amount of displacement is tight can be improved and yield can be improved.

Second Embodiment

A manufacturing method of a semiconductor device according to the present embodiment can be applied to, for example, a manufacturing method of a backside-illuminated CMOS image sensor. The manufacturing method of the semiconductor device according to the present embodiment is explained below with reference to the cross-sectional views of FIG. 1 and FIG. 7 to FIG. 12.

As the first substrate 1 as a device wafer, as shown in FIG. 1, for example, a SOI wafer or a single- or multilayer epitaxial substrate is used. The first substrate 1 includes the silicon layer 10, a BOX oxide film that functions as the etching stopper layer 3 to be described later, and the silicon layer 4.

A process called FEOL (Front End of Line), such as a lithography process, a film forming process, an etching process, and an ion implantation process, is repeatedly performed on the silicon layer 4 (photodiode layer) to form an active layer, and moreover, devices, such as transistors and photodiodes, are manufactured in the active layer.

In the present embodiment, thereafter, as shown in FIG. 7, through electrodes 5 are formed around the photodiodes of the silicon layer 4 to be electrically connected to the back surface after the subsequent removing process of the first substrate 1. For the through electrode 5, for example, a side conduction in which a sidewall of a DT (Deep Trench) or the like is coated with a conductive film or a structure in which a conductive material is embedded in a DT can be used.

Thereafter, as shown in FIG. 8, the wiring layer 7 for electrical connection is formed in a process called BEOL (Back End of Line). For example, the wires 70 of the wiring layer 7 may be Cu of a damascene structure. Moreover, Al may be used for the upper wires 71. The dielectric layer 6 that covers the wires 70 and the upper wires 71 is, for example, a TEOS (Tetra Ethyl Ortho Silicate) film.

Figure 9:
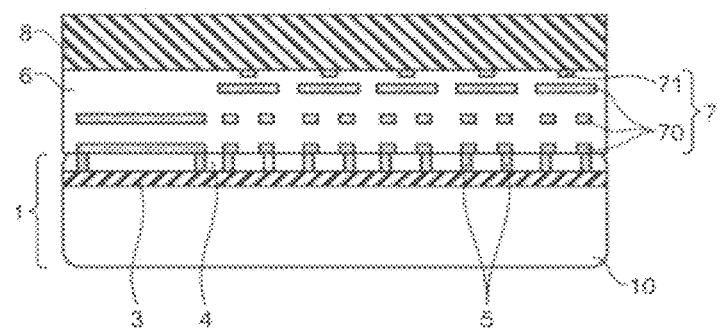
FIG. 9 is a cross-sectional view illustrating one process of the manufacturing method of the semiconductor device according to the second embodiment.

An outermost surface after forming the wiring layer 7 becomes a bonding surface and therefore needs to be planarized. For example, a process (CVD, application, or the like) of forming the dielectric film 8 and a process (CMP (Chemical Mechanical Polish), RIE, or the like) of grinding the dielectric film 8 are repeatedly performed to form the dielectric film 8 to be a flat outermost surface as shown in FIG. 9. When the wiring layer 7 includes only a Cu wire of a damascene structure, the wiring layer 7 is planarized by CMP when forming the damascene structure, so that the outermost surface does not necessarily need to be planarized again. Moreover, the dielectric film 8 as the bonding surface may be an oxide film, or $SiO_2$ using TEOS or the like as a material or a Low-k film may be used for the dielectric film 8. In the manner, on the surface of the first substrate 1, a layer, in which transistors and the like are formed, and the wiring layer 7 for electrical connection are formed on the photodiode layer 4, and the upper layer thereof is covered by the dielectric film 8 to be the bonding surface.

Figure 10:
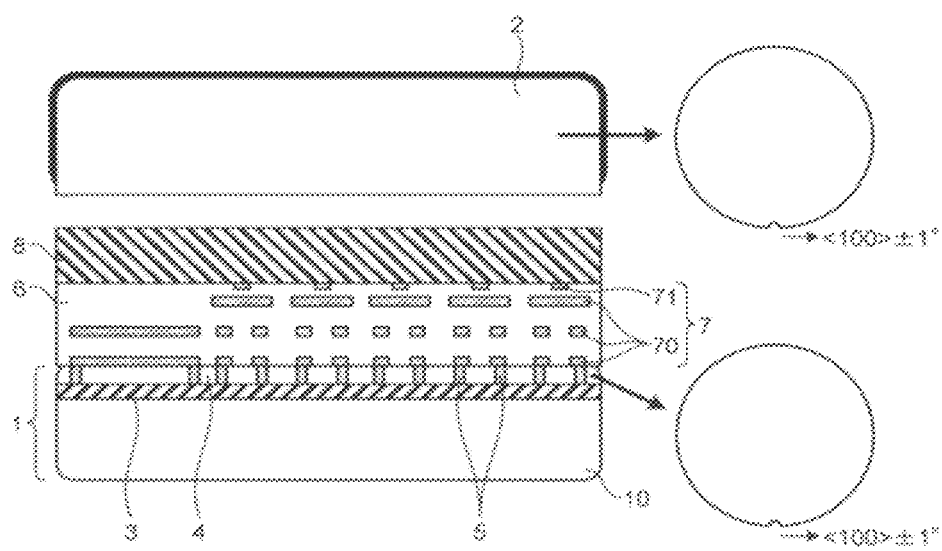
FIG. 10 is a cross-sectional view illustrating one process of the manufacturing method of the semiconductor device according to the second embodiment.

The first substrate 1 subjected to the above processes is bonded to the second substrate 2 as a support wafer as shown in FIG. 10. The first substrate 1 and the second substrate 2 are bonded so that the crystal orientation of the silicon layer 4 (photodiode layer) of the first substrate 1 and the crystal orientation of the second substrate 2 are the same. For example, as shown in FIG. 10, the crystal orientations are matched by bonding substrates, in which an arrow direction viewed from a notch becomes a <100> direction, so that the notches are aligned. When the crystal orientations of the silicon layer 10 and the silicon layer 4 are aligned (same), the two substrates, i.e., the first substrate 1 and the second substrate 2 are aligned without positional displacement. The direction of the crystal orientations to be aligned does not necessarily need to be a <100> direction, and if the internal stress of the substrates can be relieved, the direction may be a <110> direction or may be different from each other as long as the crystal orientations are aligned in the same direction. An SOI substrate may be used as the second substrate 2.

The surface of the second substrate 2 may be, for example, an unprocessed substrate surface. Alternatively, the surface of the second substrate 2 may be a surface obtained by once forming a film thereon and exposing the substrate surface by performing dry etching, such as RIE, on the surface of the film. Moreover, a $SiO_2$ using TEOS as a material, a thermal oxide $SiO_2$ film, or the like may be the bonding surface of the second substrate 2. Alternatively, a surface of a dielectric layer formed on a wiring layer may be the bonding surface of the second substrate 2.

Figure 11:
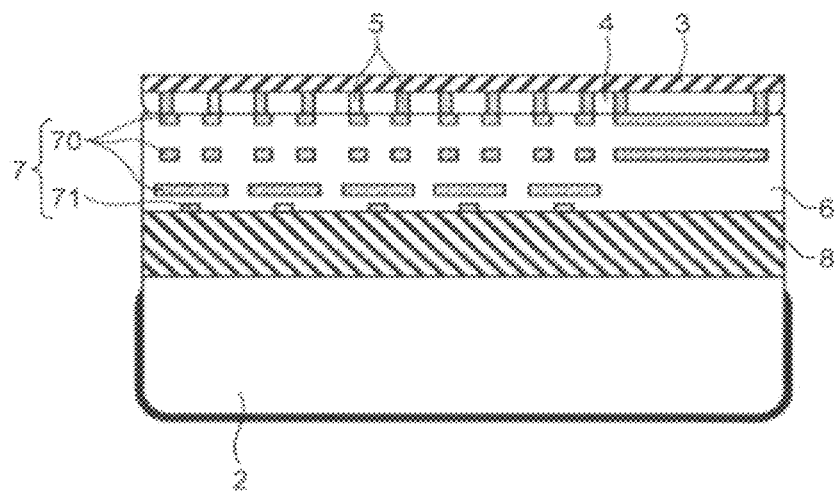
FIG. 11 is a cross-sectional view illustrating one process of the manufacturing method of the semiconductor device according to the second embodiment.

Details of the process of bonding the first substrate 1 and the second substrate 2, the annealing, and the like are similar to the first embodiment. After bonding the first substrate 1 and the second substrate 2, as shown in FIG. 11, the surface on the first substrate 1 side is thinned by BSG (Back Side Grind) by mechanical grinding, a chemical liquid process (hydrofluoric-nitric acid, KOH, TMAH), or the like. In the thinning process, for example, the substrate is processed while controlling accuracy of in-plane uniformity, roughness, and the like by performing end point detection by the etching stopper layer 3 or thickness control. Specially, when the etching stopper layer 3 is used, a BOX oxide film of a SOI wafer or a concentration difference of a multilayer epitaxial substrate is used as the etching stopper layer 3.

Figure 12:
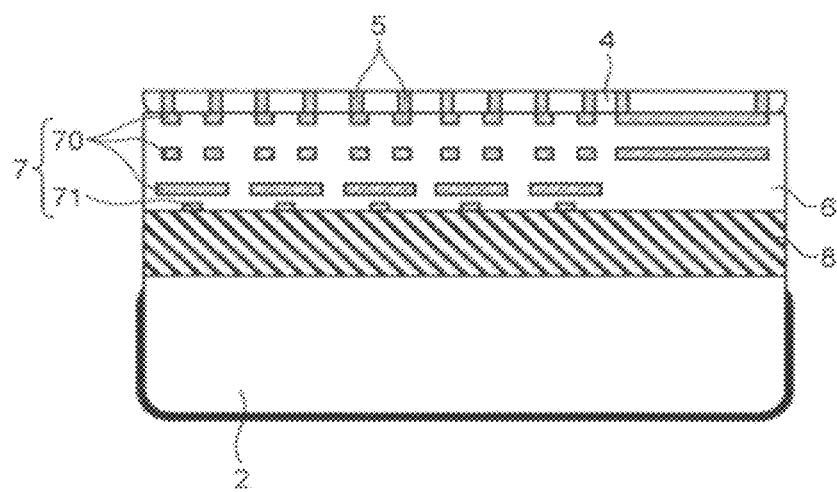
FIG. 12 is a cross-sectional view illustrating one process of the manufacturing method of the semiconductor device according to the second embodiment.

Thereafter, in the process of removing the etching stopper layer 3 by RIE or chemicals and causing the through electrodes 5 to expose as shown in FIG. 12, it is needed to ensure a step with which an alignment mark can be easily detected in a lithography process when forming a pad and wires in the subsequent process or have a structure with which an alignment mark can be easily detected.

Thereafter, a pad (hereinafter, not shown) needs to be formed on the silicon layer 4 in FIG. 12 for drawing out an electrode to a package from the through electrodes 5. Typically, an Al wire is used for a pad, and the pad is formed immediately above the through electrodes 5 or in an outer peripheral portion of the through electrodes 5. For example, the pad can be manufactured by forming a wiring layer by lithography, CVD, and sputtering. At this time, a light shielding layer of a circuit portion and the like may be formed concurrently. Moreover, a film that can improve sensor characteristics may be formed on the sensor.

Thereafter, an antireflection film, color filters, and microlenses are formed to complete a process called wafer process. Next, in a package process called back end, singulation by dicing, mounting on a ceramic package or the like, electrical connection between the electrodes and the package by wire bonding, mounting of a protection glass, and resin sealing are performed, so that functions as a sensor semiconductor device are completed.

In the lithography process after the thinning, a mask and an alignment mark need to be aligned with high accuracy. If the alignment accuracy in this process is low, an amount of displacement between the photodiodes and the color filters increases and pixel characteristics degrade. However, when the alignment reference in the CF process is a mark before the thinning, it is not limited to the above.

It is needed that a mark to be a reference is not displaced from the photodiodes for sufficiently ensuring the alignment accuracy in the CF process. In other words, stress and distortion of a layer, in which DTs for forming the through electrodes 5 are formed, need to be reduced. As a reference mark, for example, a DT mark or a mark in the first lithography process after the thinning is used. In order to reduce displacement between the reference mark and the photodiodes, it is important to reduce the internal stress generated when bonding the first substrate 1 and the second substrate 2, that is, to reduce the internal stress of the first substrate 1 itself in addition to ensuring the alignment accuracy in the lithography process. Consequently, distortion due to the bonding can be reduced, so that yield and a sensor performance improve.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:
   forming a photodiode layer, which is an active region including a photodiode, on a main surface of a first substrate, the first substrate being a substrate in which a crystal orientation in a three o'clock direction is a <100> direction when a notch is in a six o'clock direction;
   forming a wiring layer, which includes a wire and a dielectric layer covering the wire, on the photodiode layer;
   forming a dielectric film on the wiring layer;
   bonding a second substrate to the dielectric film of the first substrate by aligning the notch of the first substrate and a notch of the second substrate, so that a crystal orientation of the photodiode layer matches a crystal orientation of the second substrate, the second substrate being a substrate in which the crystal orientation in a three o'clock direction is a <100> direction when the notch is in a six o'clock direction; and
   forming a through electrode in the photodiode layer after the forming the photodiode layer and before the forming the wiring layer.

2. The manufacturing method of a semiconductor device according to claim 1, further comprising, after the forming the dielectric film and before the bonding:
   cleaning bonding surfaces of the first substrate and the second substrate; and
   activating the bonding surfaces.

3. The manufacturing method of a semiconductor device according to claim 1, further comprising performing annealing after the bonding.

4. The manufacturing method of a semiconductor device according to claim 3, further comprising thinning a surface on a side opposite to the main surface of the first substrate after the annealing.

5. The manufacturing method of a semiconductor device according to claim 1, further comprising thinning a surface on a side opposite to the main surface of the first substrate after the bonding.

6. The manufacturing method of a semiconductor device according to claim 5, wherein the first substrate is a SOI wafer.

7. The manufacturing method of a semiconductor device according to claim 6, wherein, in the thinning, a BOX oxide film included in the SOI wafer is used as an etching stopper layer.

8. The manufacturing method of a semiconductor device according to claim 1, wherein the first substrate is a SOI wafer or a single- or multilayer epitaxial substrate.

9. The manufacturing method of a semiconductor device according to claim 1, wherein the second substrate is a SOI wafer.

10. A manufacturing method of a semiconductor device comprising:
    forming a photodiode layer, which is an active region including a photodiode, on a main surface of a first substrate, the first substrate being a substrate in which a crystal orientation in a three o'clock direction is a <110> direction when a notch is in a six o'clock direction;
    forming a wiring layer, which includes a wire and a dielectric layer covering the wire, on the photodiode layer;
    forming a dielectric film on the wiring layer;
    bonding a second substrate to the dielectric film of the first substrate, by aligning the notch of the first substrate and a notch of the second substrate, so that a crystal orientation of the photodiode layer matches a crystal orientation of the second substrate, the second substrate being a substrate in which the crystal orientation in a three o'clock direction is a <110> direction when the notch is in a six o'clock direction; and
    forming a through electrode in the photodiode layer after the forming the photodiode layer and before the forming the wiring layer.

11. The manufacturing method of a semiconductor device according to claim 10, wherein the first substrate is a SOI wafer or a single- or multilayer epitaxial substrate.

\* \* \* \* \*